(12) United States Patent
Watanabe et al.

(10) Patent No.: US 9,635,762 B2
(45) Date of Patent: Apr. 25, 2017

(54) SEMICONDUCTOR PACKAGE

(71) Applicant: J-DEVICES CORPORATION, Oita (JP)

(72) Inventors: Shinji Watanabe, Kanagawa (JP); Sumikazu Hosoyamada, Kanagawa (JP); Shingo Nakamura, Kanagawa (JP); Hiroshi Demachi, Kanagawa (JP); Takeshi Miyakoshi, Kanagawa (JP); Tomoshige Chikai, Kanagawa (JP); Kiminori Ishido, Kanagawa (JP); Hiroaki Matsubara, Kanagawa (JP); Takashi Nakamura, Kanagawa (JP); Hirokazu Honda, Kanagawa (JP); Yoshikazu Kumagaya, Kanagawa (JP); Shotaro Sakumoto, Kanagawa (JP); Toshihiro Iwasaki, Kanagawa (JP); Michiaki Tamakawa, Kanagawa (JP)

(73) Assignee: J-DEVICES CORPORATION, Oita (JP)

( * ) Notice: Subject to any disclaimer, the term of this patent is extended or adjusted under 35 U.S.C. 154(b) by 0 days.

(21) Appl. No.: 14/803,889

(22) Filed: Jul. 20, 2015

(65) Prior Publication Data
US 2016/0027715 A1    Jan. 28, 2016

(30) Foreign Application Priority Data
Jul. 24, 2014  (JP) .................................. 2014-150374

(51) Int. Cl.
*H01L 23/02*  (2006.01)
*H01L 23/10*  (2006.01)
(Continued)

(52) U.S. Cl.
CPC ............ *H05K 1/181* (2013.01); *H01L 23/36* (2013.01); *H01L 23/3675* (2013.01);
(Continued)

(58) Field of Classification Search
CPC ... H01L 23/3677; H01L 23/36; H01L 23/367; H01L 23/3675; H01L 23/373; H05K 1/0204
(Continued)

(56) References Cited

U.S. PATENT DOCUMENTS 5,834,337 A * 11/1998 Unger ................. H01L 23/3733
257/E23.112
6,919,631 B1 * 7/2005 Hoffman ............. H01L 23/3128
257/686
(Continued)

FOREIGN PATENT DOCUMENTS

JP    H10-12780 A    1/1998

*Primary Examiner* — Luan C Thai
(74) *Attorney, Agent, or Firm* — Typha IP LLC

(57) ABSTRACT

A stacked semiconductor package includes a first semiconductor package including a first circuit board and a first semiconductor device mounted on the first circuit board; a second semiconductor package including a second circuit board and a second semiconductor device mounted on the second circuit board, the second semiconductor package being stacked on the first semiconductor package; and a heat transfer member provided on the first semiconductor device and a part of the first circuit board, the part being around the first semiconductor device.

11 Claims, 16 Drawing Sheets

(51) Int. Cl.
  *H05K 1/18*      (2006.01)
  *H01L 23/367*    (2006.01)
  *H05K 1/02*      (2006.01)
  *H01L 25/10*     (2006.01)
  *H01L 23/36*     (2006.01)
  *H01L 23/373*    (2006.01)
  *H01L 23/433*    (2006.01)
  *H01L 23/498*    (2006.01)
  *H01L 23/31*     (2006.01)

(52) U.S. Cl.
  CPC ...... *H01L 23/3677* (2013.01); *H01L 23/3733* (2013.01); *H01L 23/4334* (2013.01); *H01L 25/105* (2013.01); *H05K 1/0204* (2013.01); H01L 23/3128 (2013.01); H01L 23/49816 (2013.01); H01L 2224/16227 (2013.01); H01L 2224/32225 (2013.01); H01L 2224/45144 (2013.01); H01L 2224/48091 (2013.01); H01L 2224/48227 (2013.01); H01L 2224/73204 (2013.01); H01L 2224/73265 (2013.01); H01L 2225/1023 (2013.01); H01L 2225/1058 (2013.01); H01L 2225/1094 (2013.01); H01L 2924/15331 (2013.01); H01L 2924/1815 (2013.01); *H05K 2201/0275* (2013.01); *H05K 2201/066* (2013.01); *H05K 2201/10515* (2013.01)

(58) Field of Classification Search
  USPC .................................................. 257/686, 707
  See application file for complete search history.

(56) References Cited

U.S. PATENT DOCUMENTS

| | | | | |
|---|---|---|---|---|
| 7,217,993 B2* | 5/2007 | Nishimura | ............ | H01L 25/105 257/685 |
| 7,701,040 B2* | 4/2010 | Huang | ................. | H01L 21/561 257/659 |
| 8,299,595 B2* | 10/2012 | Yoon | .................... | H01L 23/3128 257/686 |
| 8,569,869 B2* | 10/2013 | Park | ...................... | H01L 25/105 257/508 |
| 8,963,299 B2* | 2/2015 | Lin | ........................ | H01L 23/552 257/659 |
| 9,029,998 B2* | 5/2015 | Jang | ........................ | H01L 23/34 257/686 |
| 9,299,631 B2* | 3/2016 | Jang | ..................... | H01L 23/3128 |
| 2012/0119346 A1* | 5/2012 | Im | ......................... | H01L 21/563 257/690 |

\* cited by examiner

SEMICONDUCTOR PACKAGE

CROSS-REFERENCE TO RELATED APPLICATIONS

This application is based upon and claims the benefit of priority from the prior Japanese Patent Application No. 2014-150374, filed on Jul. 24, 2014, the entire contents of which are incorporated herein by reference.

FIELD

The present invention relates to a mounting technology for a semiconductor package, and specifically, to a structure of a stacked semiconductor package for alleviating heat transfer from a bottom package to a top package.

BACKGROUND

Recently, along with demands for, for example, electronic devices that are more compact and have a higher density and for an improved access speed to semiconductor devices, package on package (PoP) by which a plurality of semiconductor packages are stacked is used. For example, in mobile terminals including mobile phone, smart phones and the like, a stacked semiconductor package including a bottom package that includes a logic chip performing image processing and a top package that includes a memory chip is used.

In such a stacked semiconductor package, the chips may occasionally be close to each other so as to have a distance therebetween of, for example, 1 mm or less. In such a case, heat from the logic chip in the bottom package may be transferred to the memory chip in the top package, and as a result, the memory chip in the top package may malfunction. For this reason, it is desired to alleviate the heat transfer from the bottom package to the top package.

In the meantime, Japanese Laid-Open Patent Publication No. Hei 10-12780 proposes a semiconductor device including a heat releasing member attached to a semiconductor element mounted on a wiring board.

An embodiment of the present invention has an object of providing a stacked semiconductor package in which heat transfer from a chip in a bottom package to a chip in a top package is alleviated.

SUMMARY

A stacked semiconductor package in an embodiment according to the present invention includes a first semiconductor package including a first circuit board and a first semiconductor device mounted on the first circuit board; a second semiconductor package including a second circuit board and a second semiconductor device mounted on the second circuit board, the second semiconductor package being stacked on the first semiconductor package; and a heat transfer member provided on the first semiconductor device and a part of the first circuit board, the part being around the first semiconductor device.

In an embodiment according to the present invention, the first semiconductor package may include a plurality of joining electrode terminals joined with the second semiconductor package and provided around the first semiconductor device; and the heat transfer member may be located inner to the plurality of joining electrode terminals.

In an embodiment according to the present invention, the first semiconductor package may include a plurality of joining electrode terminals joined with the second semiconductor package and provided around the first semiconductor device; and the heat transfer member may be provided on substantially an entire surface of the first semiconductor package while enclosing the plurality of joining electrode terminals.

In an embodiment according to the present invention, the first circuit board may have a thermal via; and the heat transfer member may be in contact with the thermal via.

In an embodiment according to the present invention, the thermal via may be in contact with a power supply plane or a ground plane included in the first circuit board.

In an embodiment according to the present invention, the heat transfer member may have a thermal conductivity in a planar direction higher than a thermal conductivity thereof in a thickness direction.

In an embodiment according to the present invention, the heat transfer member may be formed of any one of carbon fiber prepreg, carbon fiber sheet and carbon graphite sheet.

In an embodiment according to the present invention, a layer having a thermal conductivity lower than the thermal conductivity in the thickness direction of the heat transfer member may be provided on the heat transfer member.

In an embodiment according to the present invention, a sealing resin may be provided on a top surface of the heat transfer member.

In an embodiment according to the present invention, the heat transfer member may have a shape of a cross having a width smaller than a length of each of sides of the first semiconductor device.

A stacked semiconductor package in another embodiment according to the present invention includes a first semiconductor package including a first circuit board and a first semiconductor device mounted on the first circuit board; a second semiconductor package including a second circuit board and a second semiconductor device mounted on the second circuit board, the second semiconductor package being stacked on the first semiconductor package; and a first heat transfer member provided on a surface of the second semiconductor device, the surface facing the first semiconductor device.

In an embodiment according to the present invention, the stacked semiconductor package may include a second heat transfer member provided on the first semiconductor device and a part of the first circuit board, the part being around the first semiconductor device.

In an embodiment according to the present invention, the first heat transfer member and the second heat transfer member may each have a thermal conductivity in a planar direction higher than a thermal conductivity thereof in a thickness direction.

DESCRIPTION OF EMBODIMENTS

Hereinafter, a stacked semiconductor package according to the present invention will be described with reference to the drawings. The stacked semiconductor package according to the present invention may be carried out in many different embodiments, and is not to be construed as being limited to the following embodiments. In the figures referred to in the following embodiments, the same component or components having substantially the same functions will bear the same reference signs, and the descriptions thereof will not be repeated.

Embodiment 1

An overview of a stacked semiconductor package 100 in embodiment 1 according to the present invention will be described with reference to FIG. 1 through FIG. 3.
(Basic Structure of the Stacked Semiconductor Package)

Figure 1:
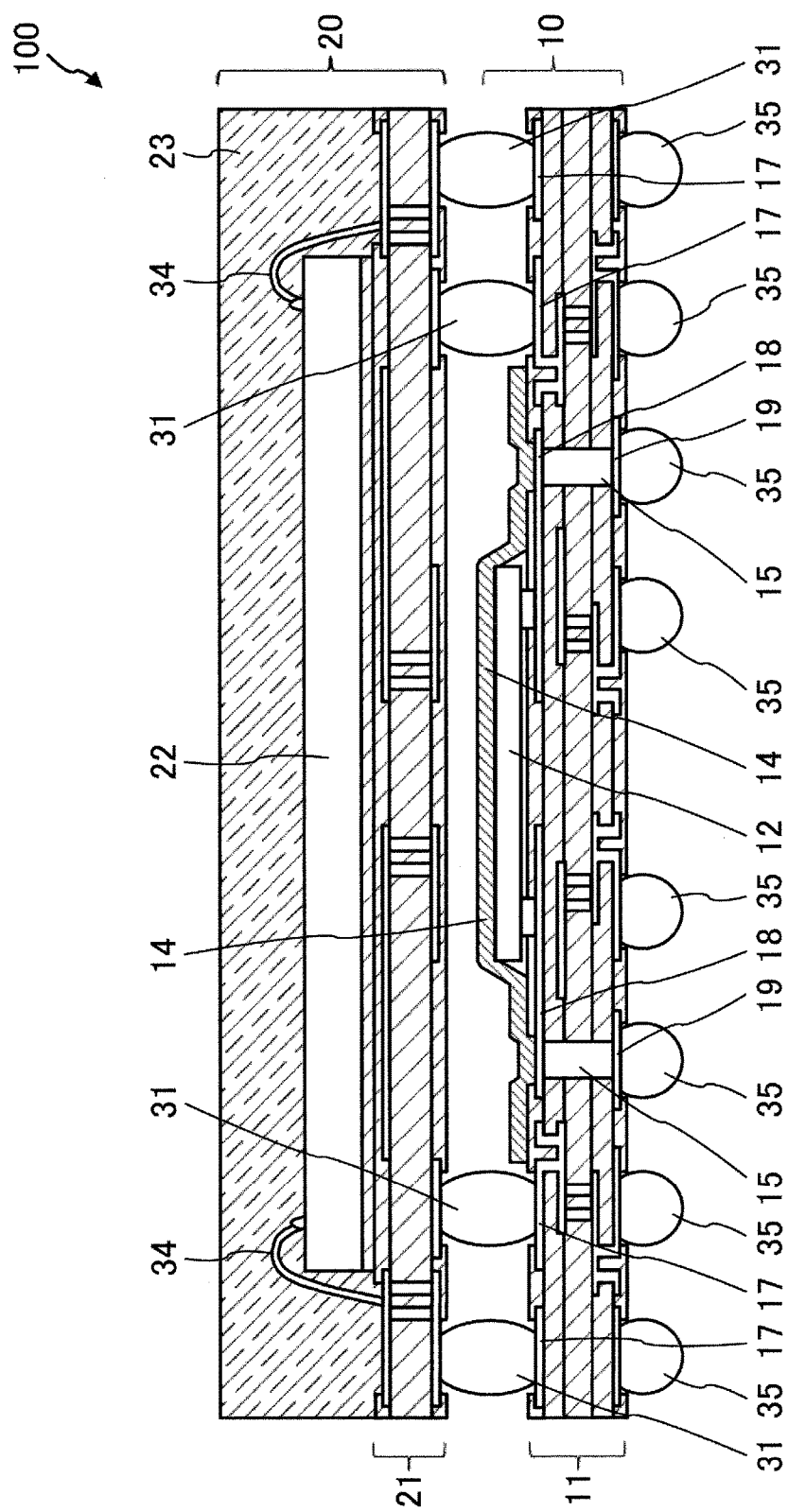
FIG. 1 is a cross-sectional view of a stacked semiconductor package in embodiment 1 according to the present invention.
Figure 2:
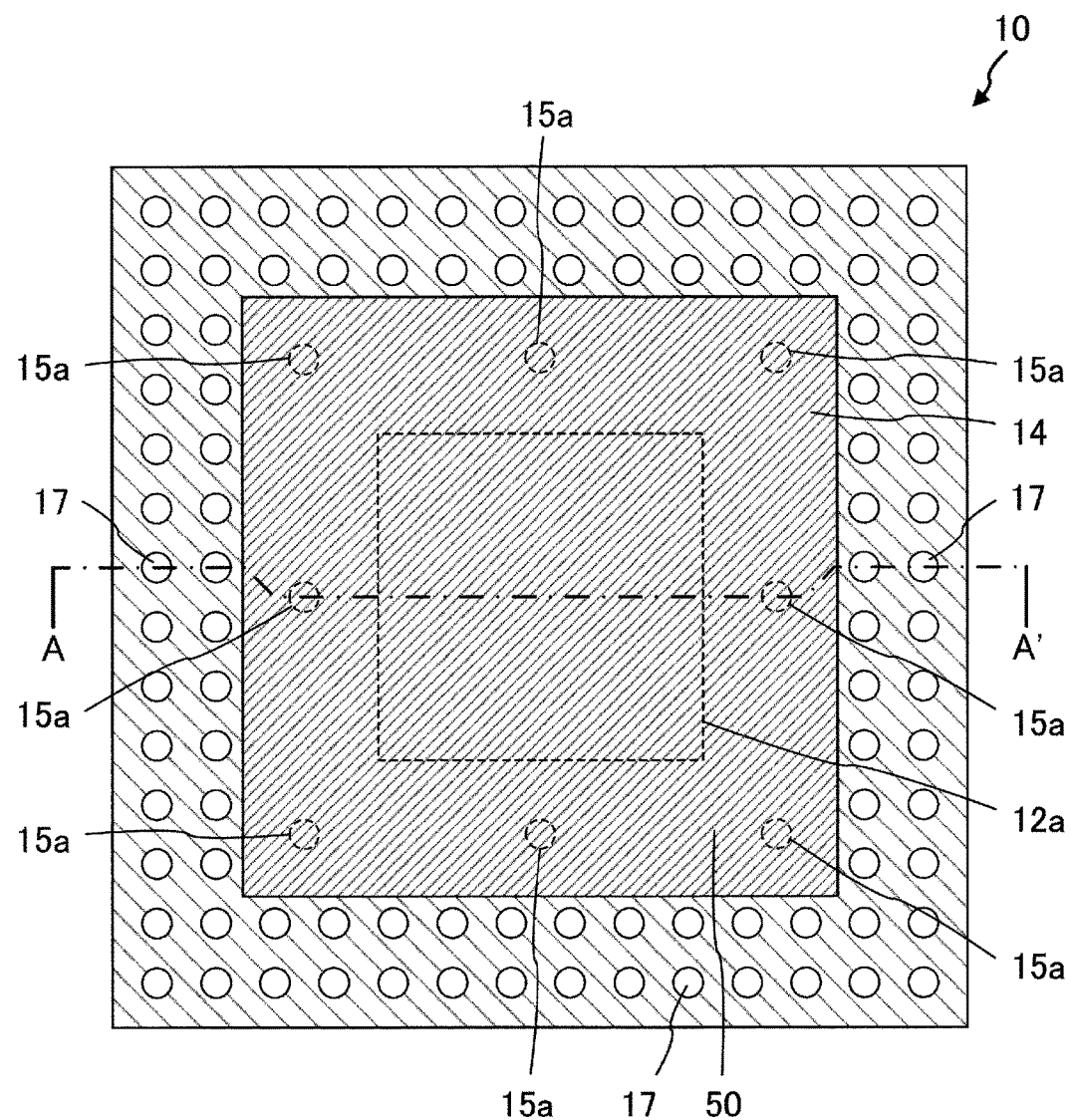
FIG. 2 is a schematic plan view of the stacked semiconductor package in embodiment 1 according to the present invention.

FIG. 1 is a cross-sectional view of the stacked semiconductor package 100 in embodiment 1 according to the present invention, taken along line A-A' (see FIG. 2). Referring to FIG. 1, it is seen that a first semiconductor package 10 and a second semiconductor package 20 are joined to each other with solder balls 31 being sandwiched therebetween, and that the second semiconductor package 20 is stacked on the first semiconductor package 10.

The first semiconductor package 10 includes a first circuit board 11 and a first semiconductor device 12 provided on the first circuit board 11. The first circuit board 11 includes one or a plurality of wiring boards. In FIG. 1, the first circuit board 11 includes four wiring boards provided in layers. The present invention is not limited to having such a structure. The first semiconductor device 12 may include, for example, an application processor or the like, but is not limited to having such a structure. In FIG. 1, the first semiconductor device 12 is shown as one component. Alternatively, a plurality of semiconductor devices may be collectively provided as the first semiconductor device 12 on the first circuit board 11.

The wiring boards included in the first circuit board 11 have lines 18 provided thereon, and parts of the lines 18 exposed on a surface of one of the wiring boards facing the second semiconductor package 20 each acts as a joining electrode terminal 17. On each of the joining electrode terminals 17, the solder ball 31 is provided. The solder balls 31 are respectively connected to electrodes provided in a bottom part of a second circuit board 21, which is included in the second semiconductor package 20. The lines 18 on the first circuit board 11 of the first semiconductor package 10 and lines on the second circuit board 21 of the second semiconductor package 20 are electrically connected to each other via the solder balls 31. The solder balls 31 also keep a distance between the first semiconductor package 10 and the second semiconductor package 20 uniform.

The second semiconductor package 20 includes the second circuit board 21, which includes one or a plurality of wiring boards. A second semiconductor device 22 is provided on the second circuit board 21. The second semiconductor device 22 is electrically connected to the lines on the second circuit board 21 by bonding wires 34 formed of Au, Cu or the like. The second semiconductor device 22 includes a memory such as, for example, a flash memory, an SDRAM or the like. A plurality of memories of the same type or a plurality of memories of different types may be located side by side on the second circuit board 21 to form the second semiconductor device 22. Alternatively, a plurality of memories may be stacked to form the second semiconductor device 22.

A sealing resin 23 is provided so as to cover the second circuit board 21 and the second semiconductor device 22. The sealing resin 23 prevents the second semiconductor device 22 and a top part of the second circuit board 21 from being contaminated with moisture or impurities entering from outside, and prevents the second circuit board 21 from being curled. The sealing resin 23 may be formed of epoxy resin, cynate ester resin, acrylic resin, polyimide resin, silicone resin or the like.

Electrodes (conductive members 19) are provided in a bottom part of the first circuit board 11 and are connected to an external mounting board on which the stacked semiconductor package 100 is to be mounted, by solder balls 35 provided below the electrodes.
(Structure for Alleviating Heat Transfer from the Semiconductor Device on the Bottom Side to the Semiconductor Device on the Top Side)

In the stacked semiconductor package 100 in embodiment 1 according to the present invention, a heat transfer member 14 is provided on the first semiconductor device 12 and on a part, of the first circuit board 11, that is around the first semiconductor device 12. Thermal vias 15 are provided in the first circuit board 11. The heat transfer member 14 is connected to the thermal vias directly or via electrodes (or lines, for example lines 18).

FIG. 2 is a plan view of the first semiconductor package 10 in the stacked semiconductor package 100 in embodiment 1 according to the present invention. The plurality of joining electrode terminals 17 are located along an outer perimeter of the first semiconductor package 10, which is square or rectangular. More specifically, the joining electrode terminals 17 are located in two lines along a top side, a bottom side, a left side and a right side of the first semiconductor package 10. It is seen that the heat transfer member 14 is located in an inner area of the first semiconductor package 10 so as to be enclosed by the plurality of joining electrode terminals 17 located along the outer perimeter of the first semiconductor package 10. (The top side, the bottom side, the left side and the right side are as seen in the plan view of FIG. 2.)

An area enclosed by dashed line 12a is an area where the first semiconductor device 12 is located. The first semiconductor device 12, which is square of rectangular, is located at a center of the first semiconductor package 10. It is seen that the heat transfer member 14 is located in an area larger than the area where the first semiconductor device 12 is located, so as to cover the entirety of the first semiconductor device 12. The first semiconductor device 12 is square or rectangular, and the heat transfer member 14, which is square or rectangular, is located so as to cover the first semiconductor device 12. Therefore, a hollow square or rectangular area 50 in which the heat transfer member 14 is located but the first semiconductor device 12 is not located is formed.

Circles represented by dashed line 15a are areas where the thermal vias 15 are located. In FIG. 2, eight thermal vias 15 in total are provided in the vicinity of four outer corners of the area 50 and in the vicinity of the center of each of four sides of the area 50. The number and the positions in the area 50 of the thermal vias 15 are not limited to the above.

Now, a material of, and a method for forming, the heat transfer member 14 will be described in detail.

The heat transfer member 14 is preferably formed of carbon fiber prepreg, carbon fiber sheet, carbon graphite or the like. It is desirable that the heat transfer member 14 exhibits anisotropy in a heat transfer direction, such that in the state where the heat transfer member 14 is formed on the first semiconductor device 12 and on the part, of the first circuit board 11, that is around the first semiconductor device 12, the thermal conductivity in a thickness direction (vertical direction in FIG. 1) is higher than the thermal conductivity in a planar direction (horizontal direction in FIG. 1).

In the case where carbon fiber prepreg is used to form the heat transfer member 14, carbon fiber prepreg is placed on the first semiconductor device 12 and on the part, of the first circuit board 11, that is around the first semiconductor device 12, is pressed with a pressure to have a predetermined thickness, and then is heat-treated. In a step of pressing the carbon fiber prepreg, it is desirable to perform vacuum press or vacuum lamination in order to avoid generation of voids. In the case where being heat-treated after being pressed, the carbon fiber prepreg is deformed along, and thus adheres to, for example, a stepped portion caused by the first semiconductor device 12 and the first circuit board 11 or along recessed portions formed in the first circuit board 11 in correspondence with the thermal vias 15 (see FIG. 1).

The heat transfer member 14, when being formed of carbon fiber sheet or carbon fiber prepreg, is produced as follows. First, an adhesive layer (not shown) formed of an adhesive film or the like is formed on the first semiconductor device 12 and on the part, of the first circuit board 11, that is around the first semiconductor device 12. Next, carbon fiber sheet or carbon fiber prepreg that is supplied in a cured state is placed on, and is caused to adhere to, the adhesive layer formed on the first semiconductor device 12 and on the part, of the first circuit board 11, that is around the first semiconductor device 12. In order to prevent the fiber of the carbon fiber sheet or carbon fiber prepreg from being folded by the stepped portion caused by the first semiconductor device 12 and the first circuit board 11, the fiber is desirably nonwoven cloth, rather than woven cloth.

Now, a method for forming the thermal vias 15 will be described.

First, vias are formed by etching or the like at predetermined positions in the wiring boards included in the first circuit board 11. Next, a metal material formed of metal plating, etching or the like is buried in the vias. The metal material portions buried at the predetermined positions of the plurality of wiring boards are stacked together, and thus the thermal vias 15 are formed.

Referring to FIG. 1, the lines 18 are provided on the thermal vias 15, and the conductive members (or electrodes) 19 are provided below the thermal vias 15. The lines 18 and the conductive members 19 are formed of a metal material. In this case, the heat transfer member 14 and the thermal vias 15 are connected to each other via the lines 18. Alternatively, the heat transfer member 14 and the thermal vias 15 may be connected to each other directly without forming the lines 18 on the thermal vias 15. In either case, in the case where carbon fiber sheet or carbon fiber prepreg is used to form the heat transfer member 14, an adhesive layer is needed. Therefore, the heat transfer member 14 and the thermal vias 15 are connected to each other also via the adhesive layer.

A power supply plane or a ground plane may be provided on each of the wiring boards included in the first circuit board 11, so that the thermal vias 15 are connected to the power supply planes or the ground planes. In the case where neither the power supply planes nor the ground planes are short-circuited by the thermal vias 15 or the heat transfer member 14, some of the thermal vias 15 may be connected to the power supply planes whereas the rest of the thermal vias 15 may be connected to the ground planes.

In the stacked semiconductor package 100 in embodiment 1 according to the present invention, the heat transfer member 14 is provided on the first semiconductor device 12 and on the part, of the first circuit board 11, that is around the first semiconductor device 12. This structure positively transfers heat at a top surface of the first semiconductor member 12 to the first circuit board 11. This decreases heat transfer from the first semiconductor member 12 to the second semiconductor member 22 of the second semiconductor package 20 provided above the first semiconductor package 10, and as a result, suppresses operational malfunction of the second semiconductor device 22.

In the case where the heat transfer member 14 is formed of a material having a high thermal conductivity in the planar direction, the heat at the top surface of the first semiconductor member 12 is more positively transferred in the planar direction. Therefore, the heat transfer to the second semiconductor member 22 is further decreased.

The thermal vias 15 are provided in the first circuit board 11, and the heat transfer member 14 and the thermal vias 15 are connected to each other. This transfers the heat at the top surface of the first semiconductor device 12 to the first circuit board 15 via the heat transfer member 14 and the thermal vias 15. Especially in a structure in which the conductive members 19 and the solder balls 35 are provided below the thermal vias 15, the heat is transferred to another support substrate on which the stacked semiconductor package 100 is mounted. Such a structure allows the heat to escape to the first circuit board 11 or to the outside of the stacked semiconductor package 100 via the heat transfer member 14. Therefore, the heat transfer from the first semiconductor device 12 to the second semiconductor member 22 is further decreased.

The thermal vias 15 are provided in the first circuit board 15, the power supply planes or the ground planes may be provided on the wiring boards included in the first circuit board 11, and the thermal vias 15 may be connected to the power supply planes or the ground planes. In this structure, the heat generated in the first semiconductor device 12 is diffused to the entirety of the first circuit board 11 by the power supply planes or the ground planes. Such a structure also further decreases the heat transfer from the first semiconductor device 12 to the second semiconductor member 22.

Modification 1 of Embodiment 1

A stacked semiconductor package 100 in modification 1 of embodiment 1 according to the present invention will be described in detail with reference to FIG. 3.

In the case where the heat transfer member 14 is formed of a certain material, the heat transfer member 14 may be wrinkled, or the heat transfer member 14 may not be connected properly with the first semiconductor device 12 or with the first circuit board 11, due to, for example, the thickness of the first semiconductor device 12. In order to avoid these, as shown in FIG. 3, the heat transfer member 14 may have cutouts 14s extending from corners of the square or rectangular heat transfer member 14 to corners of the first semiconductor device 12. The cutouts 14 absorb sag or the like of the heat transfer member 14 caused by the stepped portions or the like. This prevents the heat transfer member 14 from being wrinkled or prevents improper connection of the heat transfer member 14 with the first semiconductor device 12 or with the first circuit board 11.

Figure 3:
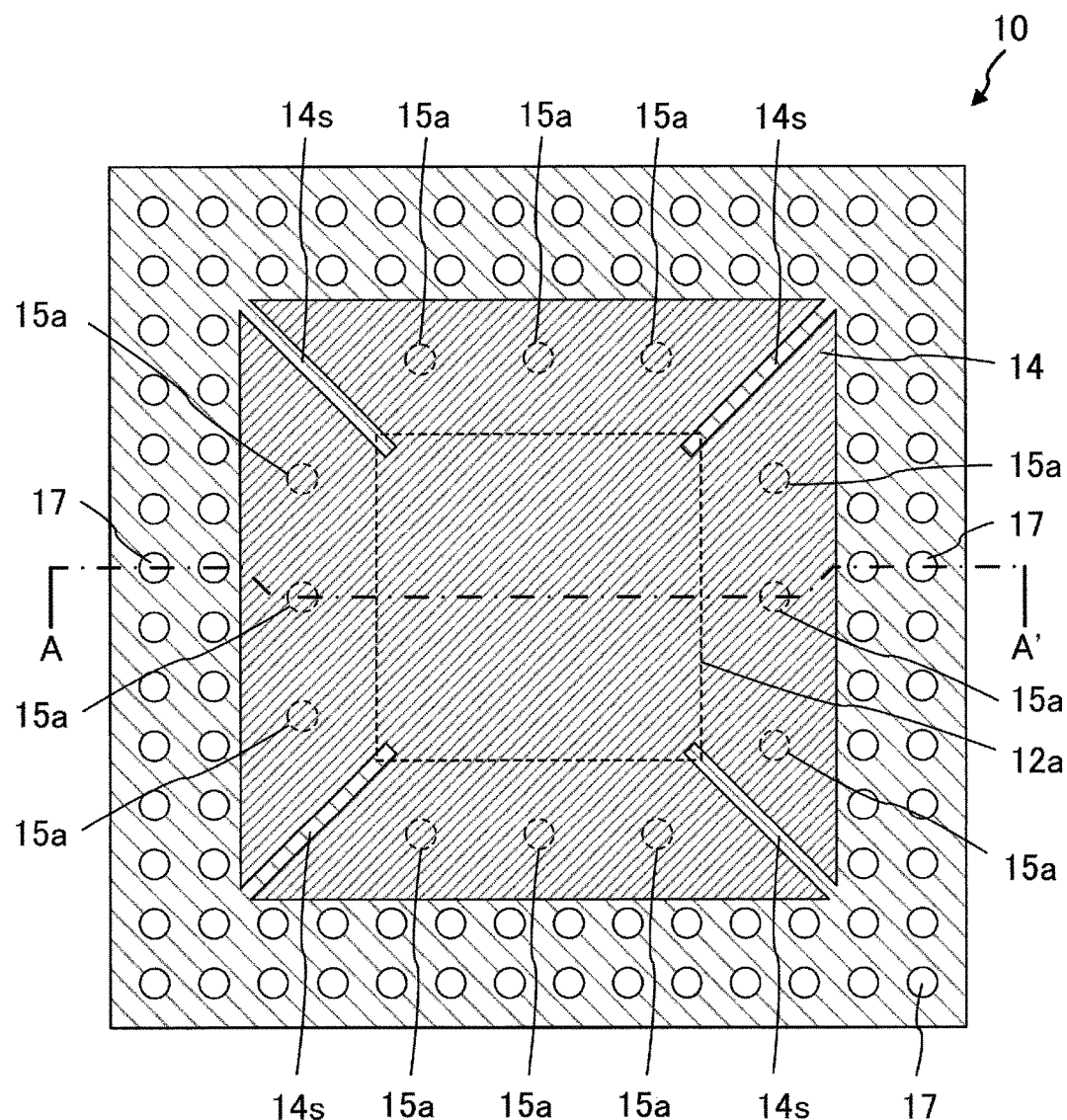
FIG. 3 is a schematic plan view of a stacked semiconductor package in a modification of embodiment 1 according to the present invention.

The width, number, positions and the like of the cutouts 14s are not limited to those shown in FIG. 3. For example, a plurality of cutouts 14s may be formed radially. The cutouts 14s may be formed to expose the first circuit board 11 or the first semiconductor device 12. Alternatively, the heat transfer member 14 may be partially folded along the cutouts 14s. The positions of the thermal vias 15 may be appropriately adjusted in accordance with the positions of the cutouts 14s. By contrast, the positions of the cutouts 14s may be appropriately adjusted in consideration of the positions where the thermal vias 15 may be formed.

Modification 2 of Embodiment 1

A stacked semiconductor package 100 in modification 2 of embodiment 1 according to the present invention will be described in detail with reference to FIG. 4.

Modification 2 provides a simpler method for preventing the wrinkles and the improper connection caused by, for example, the thickness of the first semiconductor device 12 described above regarding modification 1. As shown in FIG. 4, the heat transfer member 14 has a shape of a cross having a width slightly smaller than the length of each side of the first semiconductor device 12. The corners of the first semiconductor device 12 are not covered with the heat transfer member 14. In other words, in modification 2, the heat transfer member 14 is formed as follows. Portions of the square or rectangular heat transfer member 14 shown in FIG. 2, more specifically, a square or rectangular portion having a diagonal line extending from each of the corners of the heat transfer member 14 shown in FIG. 2 to a position closer to the center of the first semiconductor device 12 than the corresponding corner of the first semiconductor device 12, is cut off.

Figure 4:
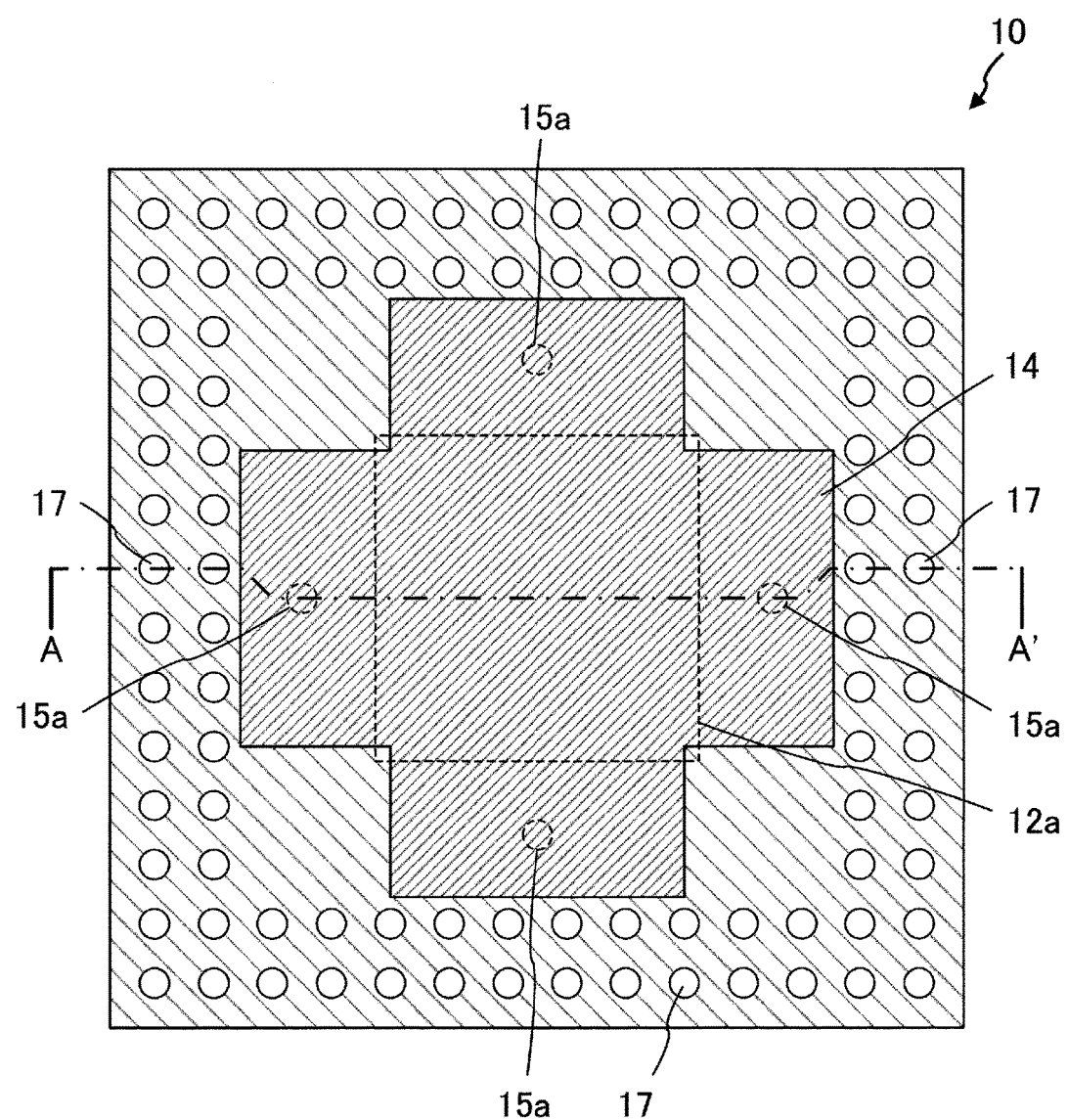
FIG. 4 is a schematic plan view of a stacked semiconductor package in another modification of embodiment 1 according to the present invention.

As shown in FIG. 4, for example, a portion of the heat transfer member 14 that extends from the center thereof through a top part (as seen in the plan view of FIG. 4) of the first semiconductor device 12 crosses the stepped portion caused by the first semiconductor device 12 and the first circuit board 11 merely perpendicularly. Therefore, the heat transfer member 14 easily absorbs the stepped portion and thus is not easily wrinkled. In modification 2, the cross-shaped heat transfer member 14 is formed by merely cutting off square or rectangular portions, of the square or rectangular heat transfer member 14, that extend from the corners of the rectangular heat transfer member 14, and placing the resultant shape of the heat transfer member 14 on the first semiconductor device 12 and the first circuit board 11. There is an advantage that the cross-shaped heat transfer member 14 is formed relatively easily.

In FIG. 4, the portions of the heat transfer member 14 that are located on the first circuit board 11 and extend outward from a top side, a bottom side, a left side and a right side (as seen in the plan view of FIG. 4) of the first semiconductor device 12 are rectangular. Modification 2 is not limited to this. For example, such portions of the heat transfer member 14 may each have a trapezoidal shape expanding as being closer to the outer perimeter of the first semiconductor package 10. In FIG. 4, one thermal via 15 is located in above, below, to the left of, and to the right of, the first semiconductor device 12. The number of the thermal vias 15 may be appropriately varied in accordance with the shape or the like of the heat transfer member 14.

Modification 3 of Embodiment 1

Figure 5:
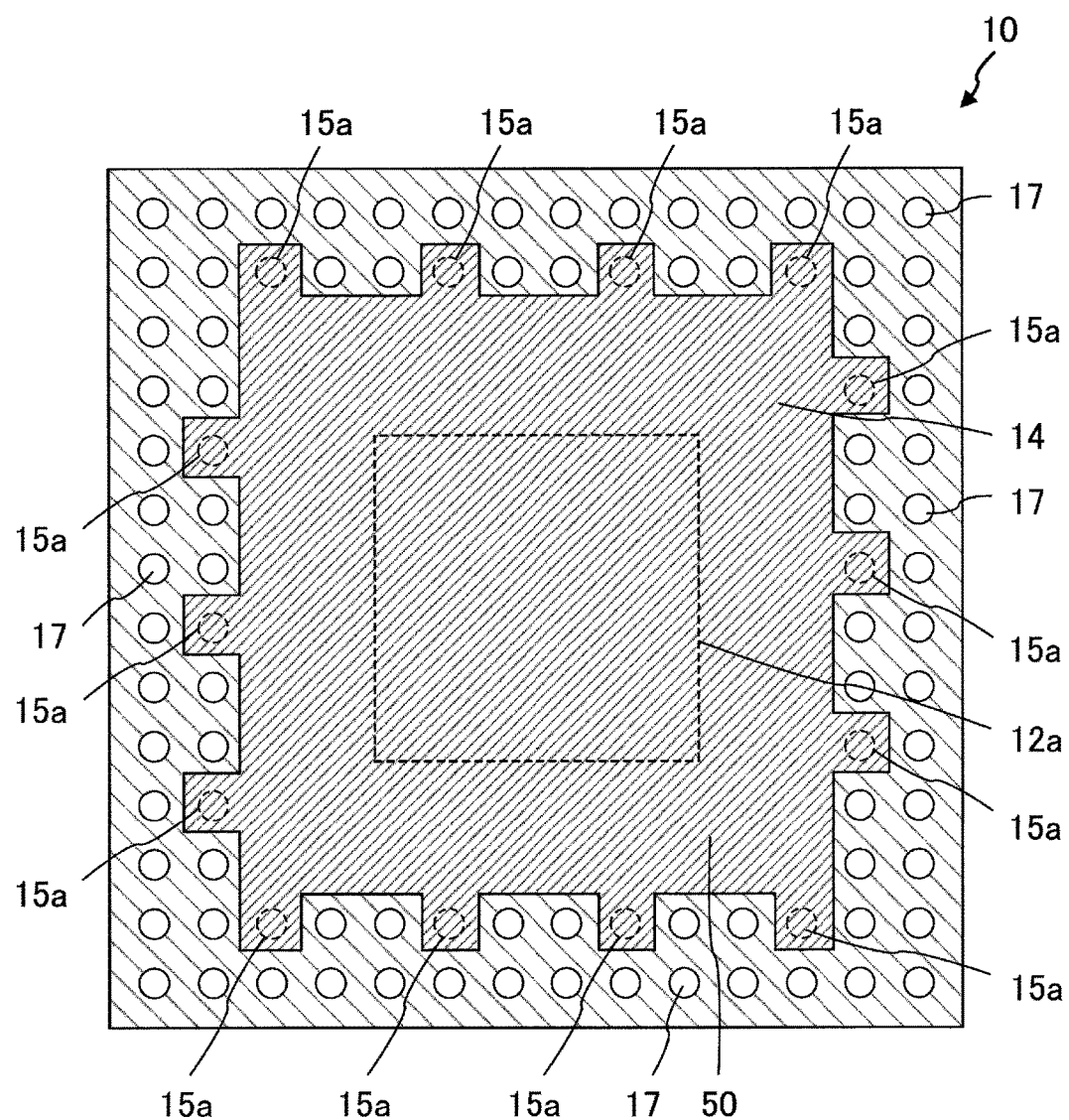
FIG. 5 is a schematic plan view of a stacked semiconductor package in still another modification of embodiment 1 according to the present invention.

A stacked semiconductor package 100 in modification 3 of embodiment 1 according to the present invention will be described in detail with reference to FIG. 5.

In embodiment 1 described above, the area 50 is hollow square or rectangular. The area 50 is not limited to having such a shape. In FIG. 2, the joining electrode terminals 17 are located in two lines, more specifically, in an inner line and an outer line, along the outer perimeter of the first circuit board 11. In FIG. 5, the joining electrode terminals 17 which are located in the inner line in FIG. 2 are partially replaced with the thermal vias 15. In FIG. 5, an outer perimeter of the area 50 has square- or rectangular-like protrusions and recesses. Alternatively, the outer perimeter of the area 50 may be rounded wave-shaped.

The above-described structure allows the heat transfer member 14 to be larger, and thus the effect of transferring, in the planar direction, the heat generated in the first semiconductor device 12 is improved. In addition, the space where the first semiconductor device 12 is located is enlarged.

The above-described structure may occasionally shorten the distance between the first semiconductor device 12 and the thermal vias 15. In this case, the heat generated in the first semiconductor device 12 is transferred more effectively to below the first semiconductor package 10 through the heat transfer member 14 and the thermal vias 15.

Embodiment 2

An overview of a stacked semiconductor package 100 in embodiment 2 according to the present invention will be described with reference to FIG. 6 and FIG. 7.

Figure 6:
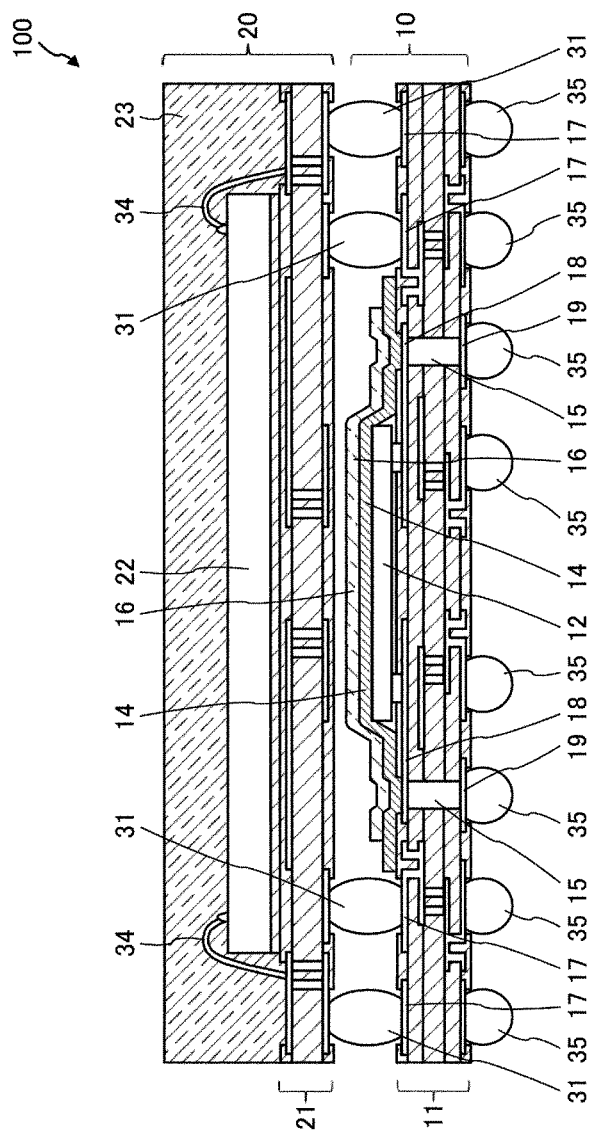
FIG. 6 is a cross-sectional view of a stacked semiconductor package in embodiment 2 according to the present invention.

FIG. 6 is a cross-sectional view of the stacked semiconductor package 100 in embodiment 2 according to the present invention. FIG. 6 is similar to FIG. 1, but is different from FIG. 1 in that a low heat transfer layer 16 having a lower thermal conductivity than the thermal conductivity in the thickness direction of the heat transfer member 14 is provided on the heat transfer member 14 in FIG. 6.

Preferably, the low heat transfer layer 16 is not contaminated with a material having a high thermal conductivity such as silica filler. The low heat transfer layer 16 is formed of, for example, epoxy-based prepreg or the like. More preferably, the low heat transfer layer 16 is formed of a material containing air uniformly, for example, a heat-insulating material such as urethane foam or the like.

The low heat transfer layer 16 may be formed on the heat transfer member 14 after the heat transfer member 14 is formed on the first semiconductor device 12 and the first circuit board 11. Alternatively, the heat transfer member 14 and the low heat transfer layer 16 may be first bonded together, and then the bonded assembly of the heat transfer member 14 and the low heat transfer layer 16 may be located on the first semiconductor device 12 and the first circuit board 11.

Figure 7:
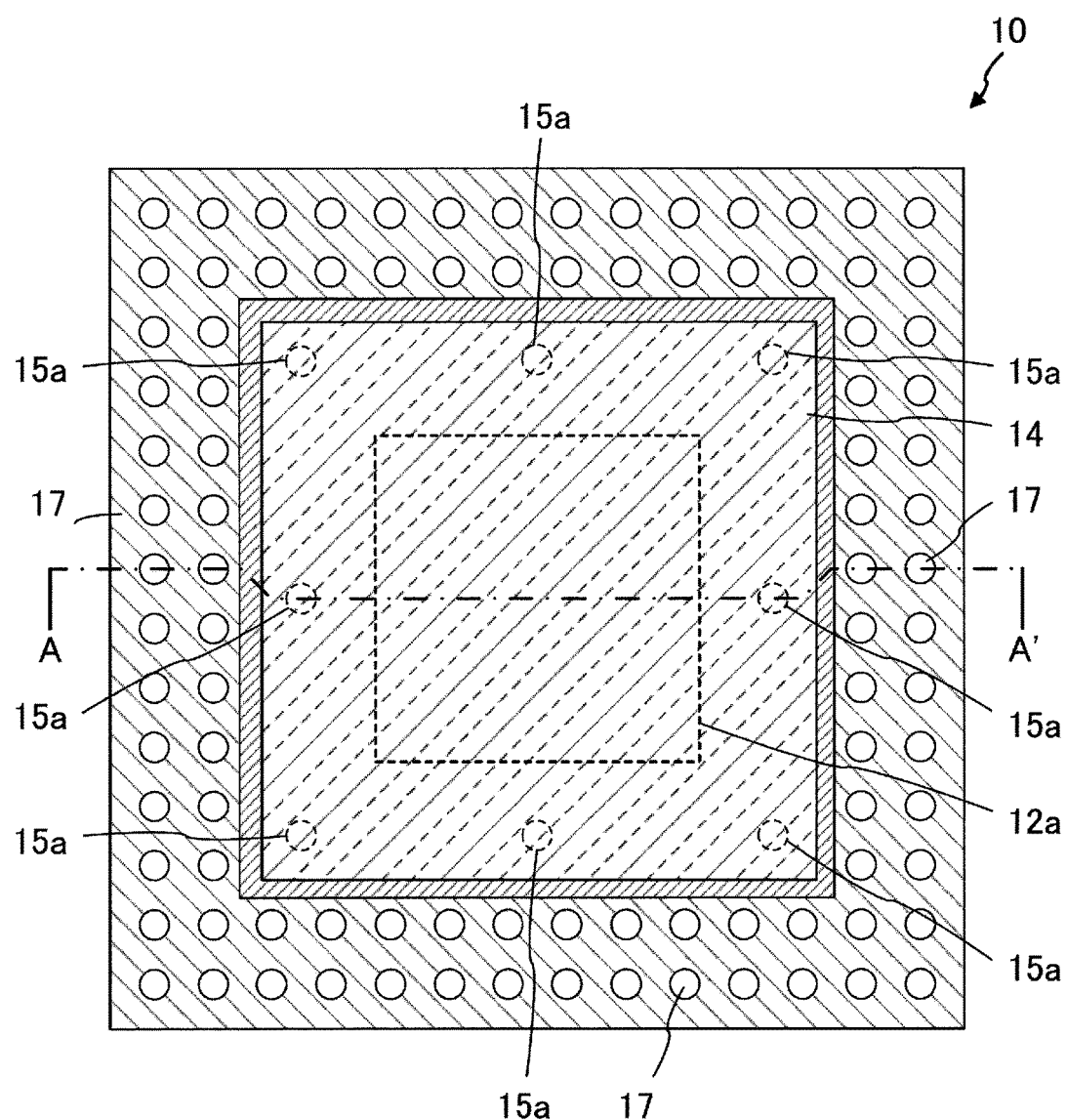
FIG. 7 is a schematic plan view of the stacked semiconductor package in embodiment 2 according to the present invention.

FIG. 7 is a plan view of the first semiconductor package 10 in the stacked semiconductor package 100 in embodiment 2 according to the present invention.

Referring to FIG. 7, it is seen that the low heat transfer layer 16 is square or rectangular and is located slightly inner to an outer perimeter of the heat transfer member 14. In FIG. 7, the low heat transfer layer 16 is located inner to the outer perimeter of the heat transfer member 14. Alternatively, the low heat transfer layer 16 may be located to cover the heat transfer member 14.

The provision of the low heat transfer layer 16 on the heat transfer member 14 positively urges the transfer, in the planar direction, of the heat generated in the first semiconductor device 12, and thus suppresses the transfer, in the thickness direction, of the heat generated in the first semiconductor device 12. As a result, the heat transfer from the first semiconductor device 12 to the second semiconductor member 22 is further decreased.

The provision of the low heat transfer layer 16 on the heat transfer member 14 avoids the heat transfer member 14 from directly contacting a bottom surface of the second semiconductor package 20. This provides an effect of enlarging the design margin regarding the distance between the first semiconductor package 10 and the second semiconductor package 20.

The low heat transfer layer 16 is located in an area having substantially the same area size as that of the area where the heat transfer member 14 is located. The present invention is not limited to having such a structure. The low heat transfer layer 16 may be located in an area having a smaller area size than that of the area where the heat transfer member 14 is located. It should be noted, however, that it is desirable that the area where the heat transfer layer 16 is located is large to a maximum possible degree in order to positively urge the transfer, in the planar direction, of the heat generated in the first semiconductor device 12.

Embodiment 3

An overview of a stacked semiconductor package 100 in embodiment 3 according to the present invention will be described with reference to FIG. 8.

Figure 8:
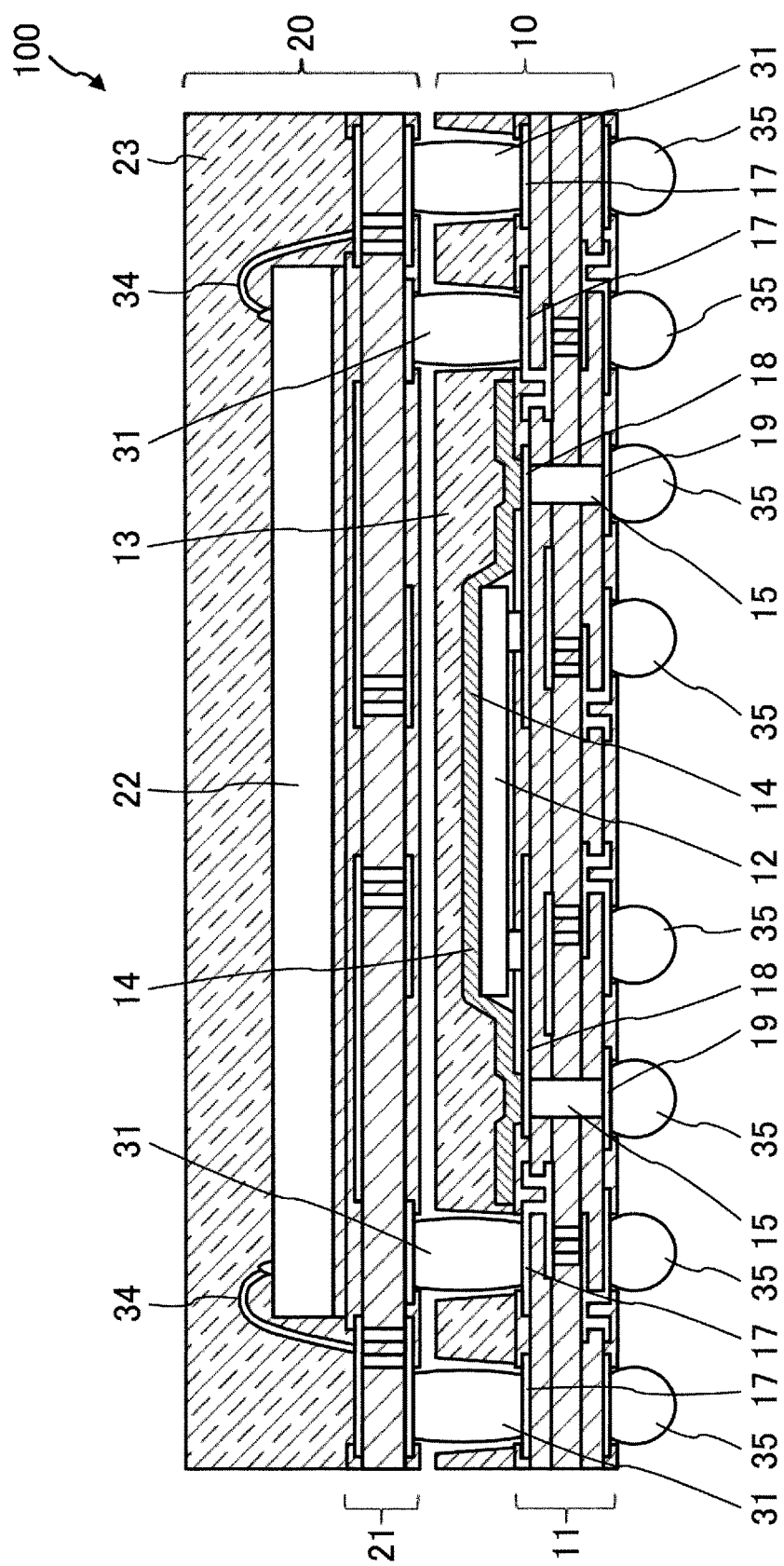
FIG. 8 is a cross-sectional view of a stacked semiconductor package in embodiment 3 according to the present invention.

FIG. 8 is a cross-sectional view of the stacked semiconductor package 100 in embodiment 3 according to the present invention. FIG. 8 is similar to FIG. 1, but is different from FIG. 1 on the following point. In FIG. 8, a sealing resin 13 is provided on the first circuit board 11, more specifically, on the heat transfer member 14 and on a part of one of the wiring boards included in the first circuit board 11 on which the heat transfer member 14 is not provided.

The sealing resin 13 prevents the first semiconductor device 12 and a top part of the first circuit board 11 from being contaminated with moisture or impurities entering from outside, and prevents the first circuit board 11 from being curled. The sealing resin 13 may be formed of epoxy resin, cynate ester resin, acrylic resin, polyimide resin, silicone resin or the like. The sealing resin 13 is desirably formed of a material having a thermal conductivity lower than the thermal conductivity in the thickness direction of the heat transfer member 14. After the sealing resin 13 is formed on the entirety of a surface of the first circuit board 11, vias in which the solder balls 31 are to be provided are formed at predetermined positions in the sealing resin 13.

The provision of the sealing resin 13 on the first circuit board 11 suppresses the heat transfer in the thickness direction of the heat transfer member 14, and thus further decreases the heat transfer from the first semiconductor device 12 to the second semiconductor device 22. Since the sealing resin 13 is provided on the heat transfer member 14, the heat transfer member 14 is avoided from directly contacting the bottom surface of the second semiconductor package 20. This provides an effect of enlarging the design margin regarding the distance between the first semiconductor package 10 and the second semiconductor package 20.

Embodiment 4

An overview of a stacked semiconductor package 100 in embodiment 4 according to the present invention will be described with reference to FIG. 9.

Figure 9:
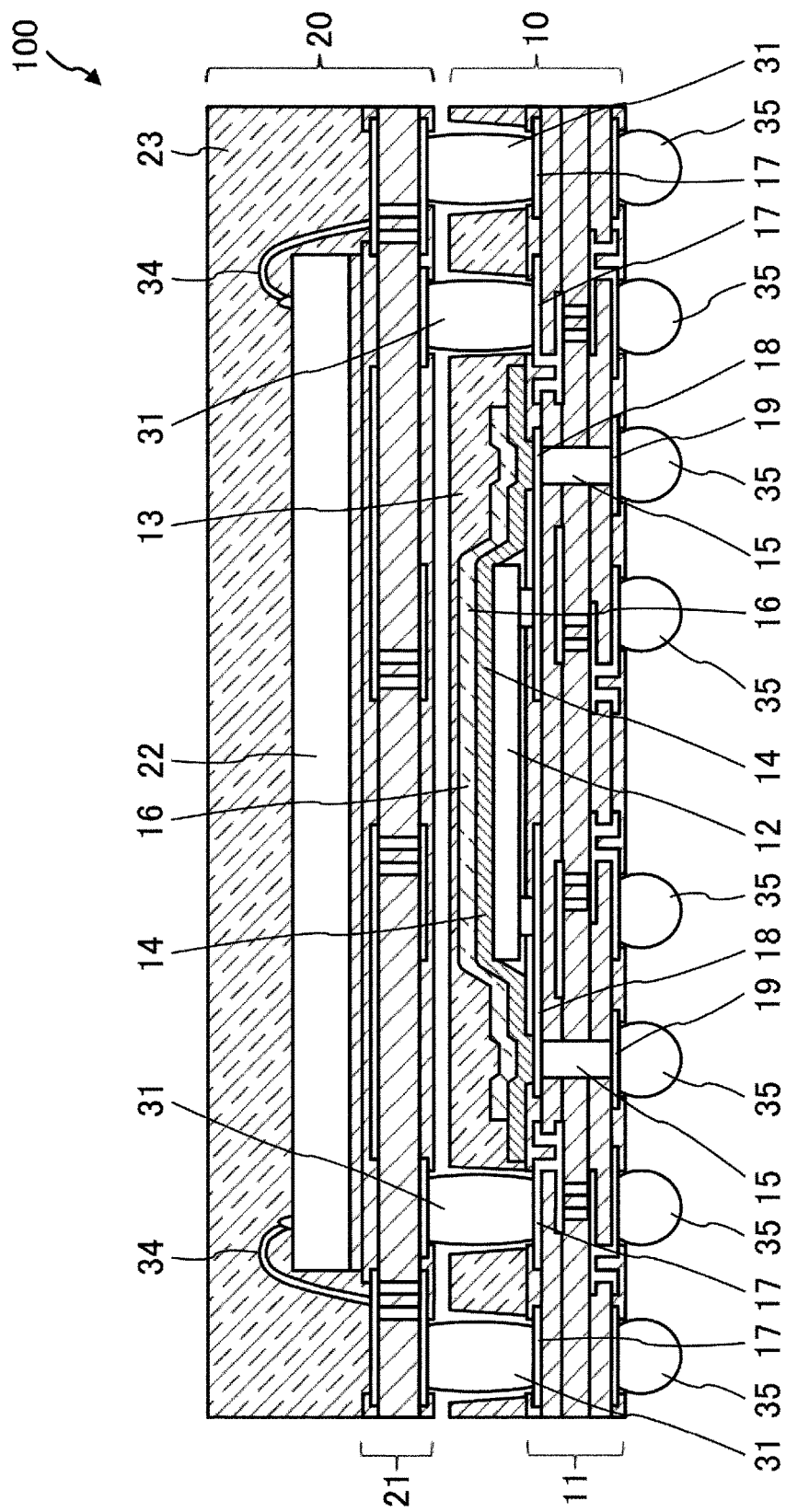
FIG. 9 is a cross-sectional view of a stacked semiconductor package in embodiment 4 according to the present invention.

FIG. 9 is a cross-sectional view of the stacked semiconductor package 100 in embodiment 4 according to the present invention. FIG. 9 is similar to FIG. 6, but is different from FIG. 6 in that the sealing resin 13 is provided on the first circuit board 11 in FIG. 9.

In embodiment 4, the sealing resin 13 is provided on the low heat transfer layer 16. In the case where the low heat transfer layer 16 is provided in an area smaller than the area where the heat transfer member 14 is located, the sealing resin 13 is also provided on the heat transfer member 14. Such a structure further improves the effect of suppressing the heat transfer in the thickness direction of the heat transfer member 14, and thus significantly decreases the heat transfer from the first semiconductor device 12 to the second semiconductor device 22.

Embodiment 5

An overview of a stacked semiconductor package 100 in embodiment 5 according to the present invention will be described with reference to FIG. 10 through FIG. 12.

Figure 10:
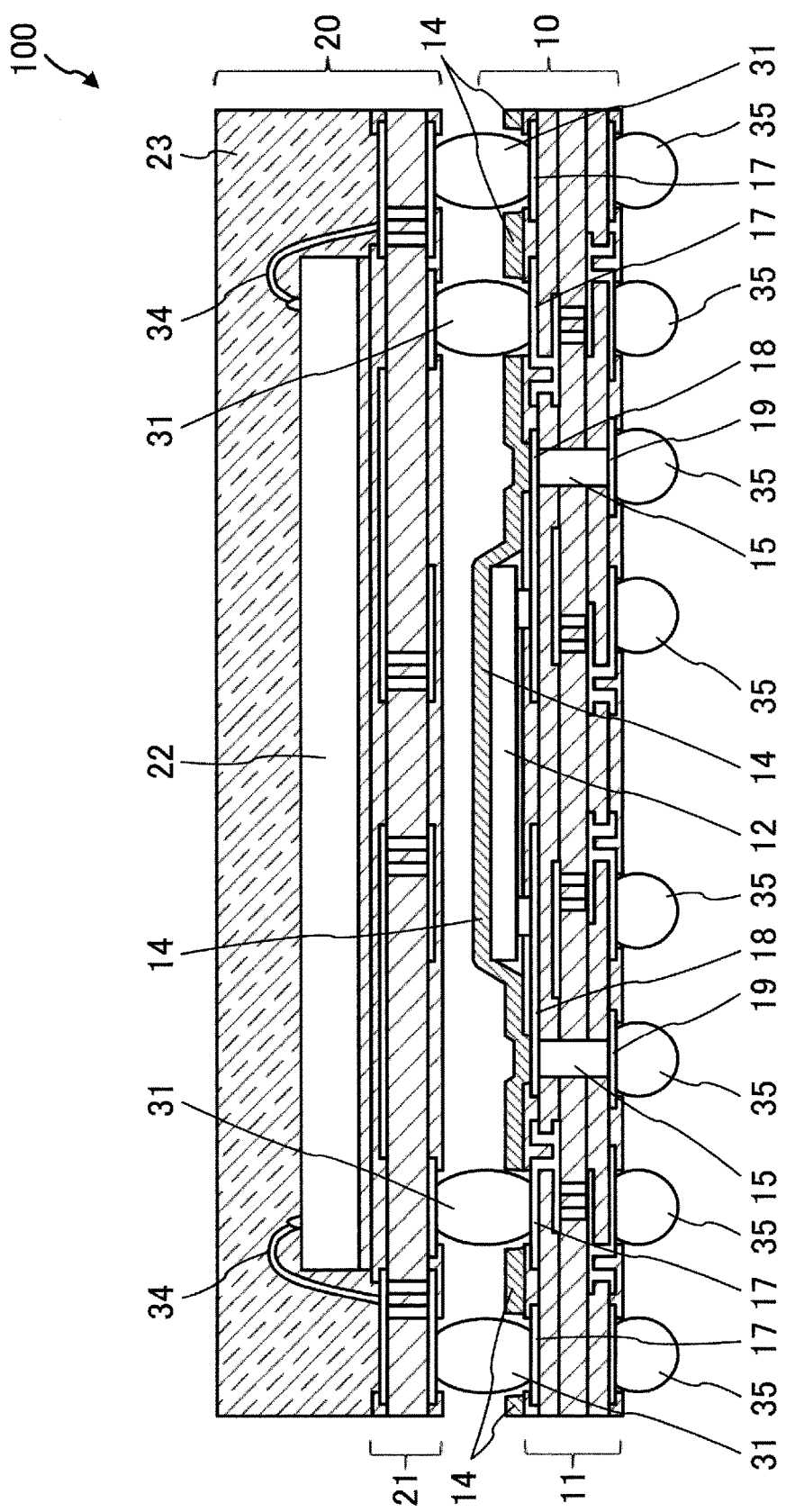
FIG. 10 is a cross-sectional view of a stacked semiconductor package in embodiment 5 according to the present invention.
Figure 11:
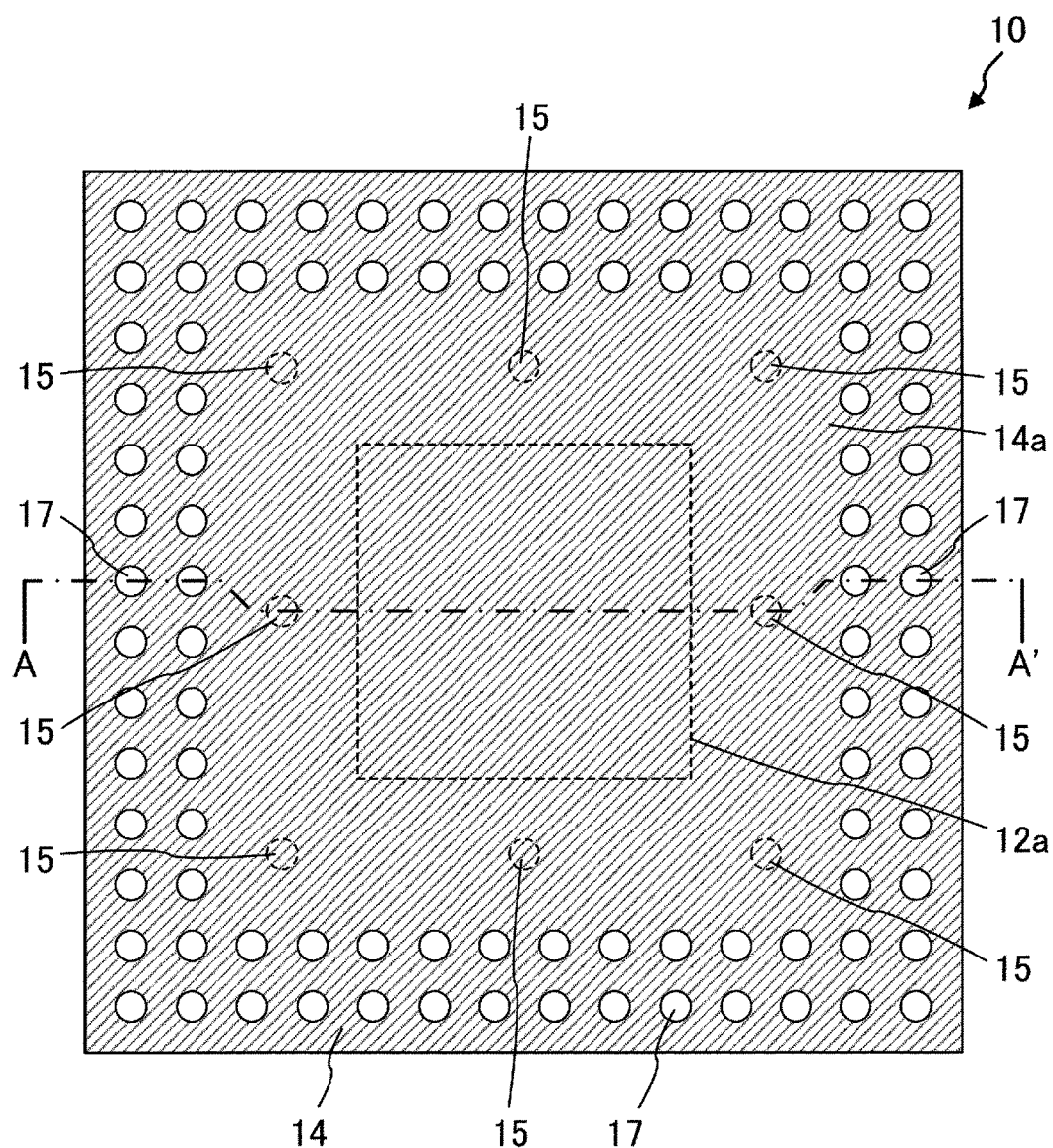
FIG. 11 is a schematic plan view of the stacked semiconductor package in embodiment 5 according to the present invention.

FIG. 10 is a cross-sectional view of the stacked semiconductor package 100 in embodiment 5 according to the present invention, taken along line A-A' (see FIG. 11). FIG. 10 is similar to FIG. 1, but is different from FIG. 1 on the following point. In FIG. 10, the heat transfer member 14 is provided also on left and right edge parts (as seen in the cross-sectional view of FIG. 10) of the top surface of the first circuit board 11 and between the two joining electrode terminals 17 located in each of the left and right parts (as seen in the cross-sectional view of FIG. 10) of the first circuit board 11.

FIG. 11 is a plan view of the first semiconductor package 10 in the stacked semiconductor package 100 in embodiment 5 according to the present invention. Referring to FIG. 11, it is seen that the heat transfer member 14 is provided on the entirety of a top surface of the first semiconductor package 10. The heat transfer member 14 in embodiment 5 is formed as follows. The heat transfer member 14 is formed on the entirety of the surface of the first semiconductor device 12 and the first circuit board 11, and then holes are formed in the heat transfer member 14 by laser ablation to expose the joining electrode terminals 17. The residues are removed by a desmear process.

The provision of the heat transfer member 14 on the entirety of the surface of the first semiconductor package 10 more positively diffuses the heat generated in the first semiconductor device 12 to the entirety of the first circuit board 11. Since the heat is prevented from concentrating to a top part of the first semiconductor device 12, the heat transfer from the first semiconductor device 12 to the second semiconductor device 22 is further decreased.

Modification of Embodiment 5

A stacked semiconductor package 100 in a modification of embodiment 5 according to the present invention will be described with reference to FIG. 12.

Figure 12:
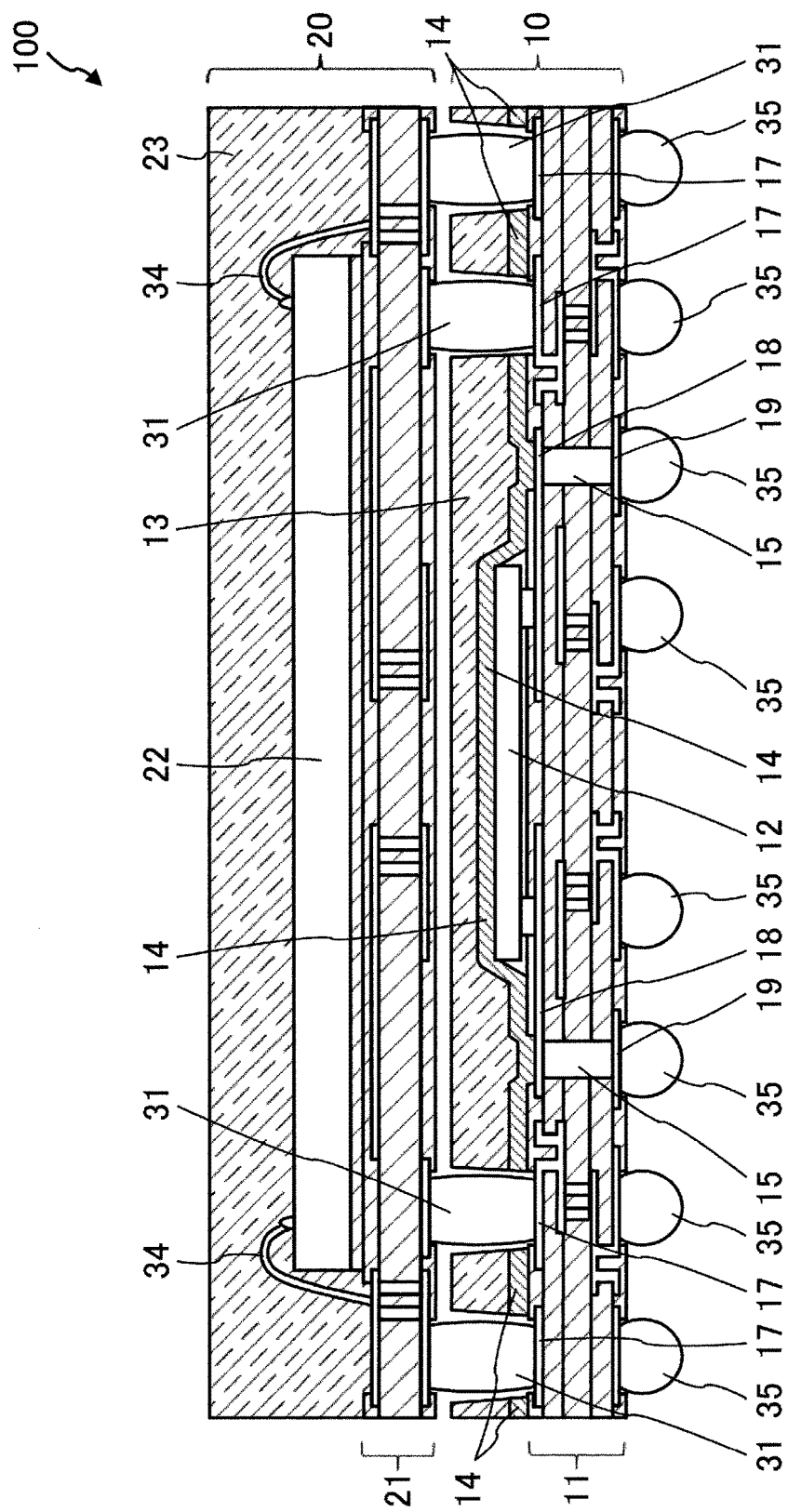
FIG. 12 is a cross-sectional view of a stacked semiconductor package in a modification of embodiment 5 according to the present invention.

Referring to FIG. 12, it is seen that a top part of the first semiconductor package 10 is filled with the sealing resin 13 and that the sealing resin 13 is provided on the heat transfer member 14. After the heat transfer member 14 is formed on the entirety of the surface of the first circuit board 11, the sealing resin 13 is provided thereon. Then, holes are formed by etching or the like in the sealing resin 13 and the heat transfer member 14 to expose the joining electrode terminals 17.

The heat transfer member 14 is provided on the entirety of the surface of the first circuit board 11, and the sealing resin 13 is provided on the heat transfer member 14. This structure suppresses the heat transfer in the thickness of the heat transfer member 14. This diffuses the heat to the entirety of the first circuit board 11 more than the structure in the embodiment shown in FIG. 10 and FIG. 11, and thus further decreases the heat transfer from the first semiconductor device 12 to the second semiconductor device 22. Since the sealing resin 13 is provided on the heat transfer member 14, the heat transfer member 14 is avoided from directly contacting the bottom surface of the second semiconductor package 20. This provides an effect of enlarging the design margin regarding the distance between the first semiconductor package 10 and the second semiconductor package 20.

Embodiment 6

An overview of a stacked semiconductor package 100 in embodiment 6 according to the present invention will be described with reference to FIG. 13 and FIG. 14.

Figure 13:
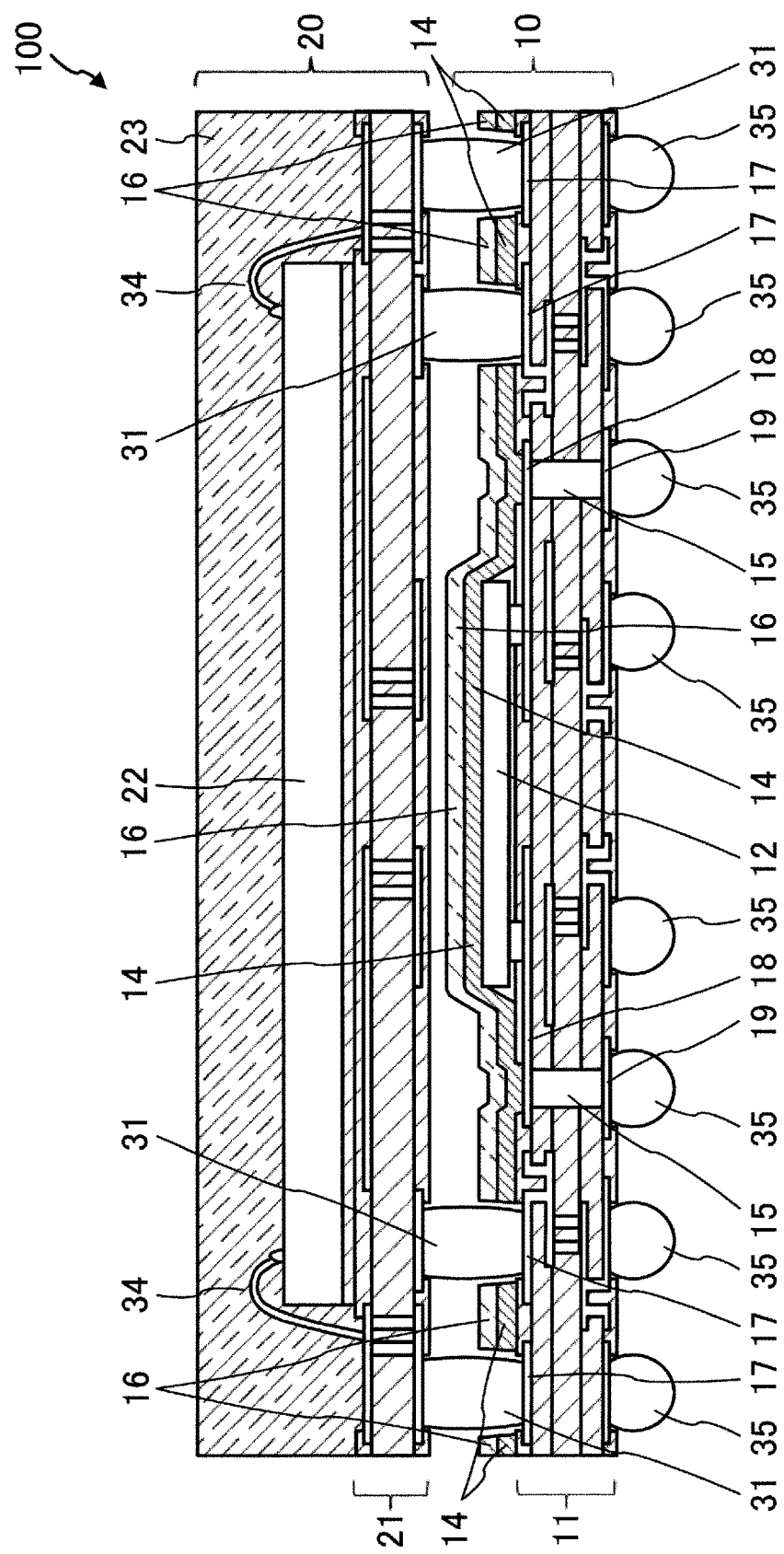
FIG. 13 is a cross-sectional view of a stacked semiconductor package in embodiment 6 according to the present invention.

FIG. 13 is a cross-sectional view of the stacked semiconductor package 100 in embodiment 6 according to the present invention. FIG. 13 is similar to FIG. 10, but is different from FIG. 10 in that the low heat transfer layer 16 is provided on the heat transfer member 14 in FIG. 13. The heat transfer member 14 is provided on the entirety of a surface of the second semiconductor device 12 and the first circuit board 11, and the low heat transfer layer 16 is provided on the heat transfer member 14. This structure positively urges the transfer, in the planar direction, of the heat generated in the first semiconductor device 12. The stacked semiconductor package 100 in embodiment 6 according to the present invention shown in FIG. 13 decreases the heat transfer from the first semiconductor device 12 to the second semiconductor device 22 more than the structure in embodiment 5 shown in FIG. 10. The provision of the low heat transfer layer 16 on the heat transfer member 14 avoids the heat transfer member 14 from directly contacting the bottom surface of the second semiconductor package 20. This provides an effect of enlarging the design margin regarding the distance between the first semiconductor package 10 and the second semiconductor package 20.

Modification of Example 6

Figure 14:
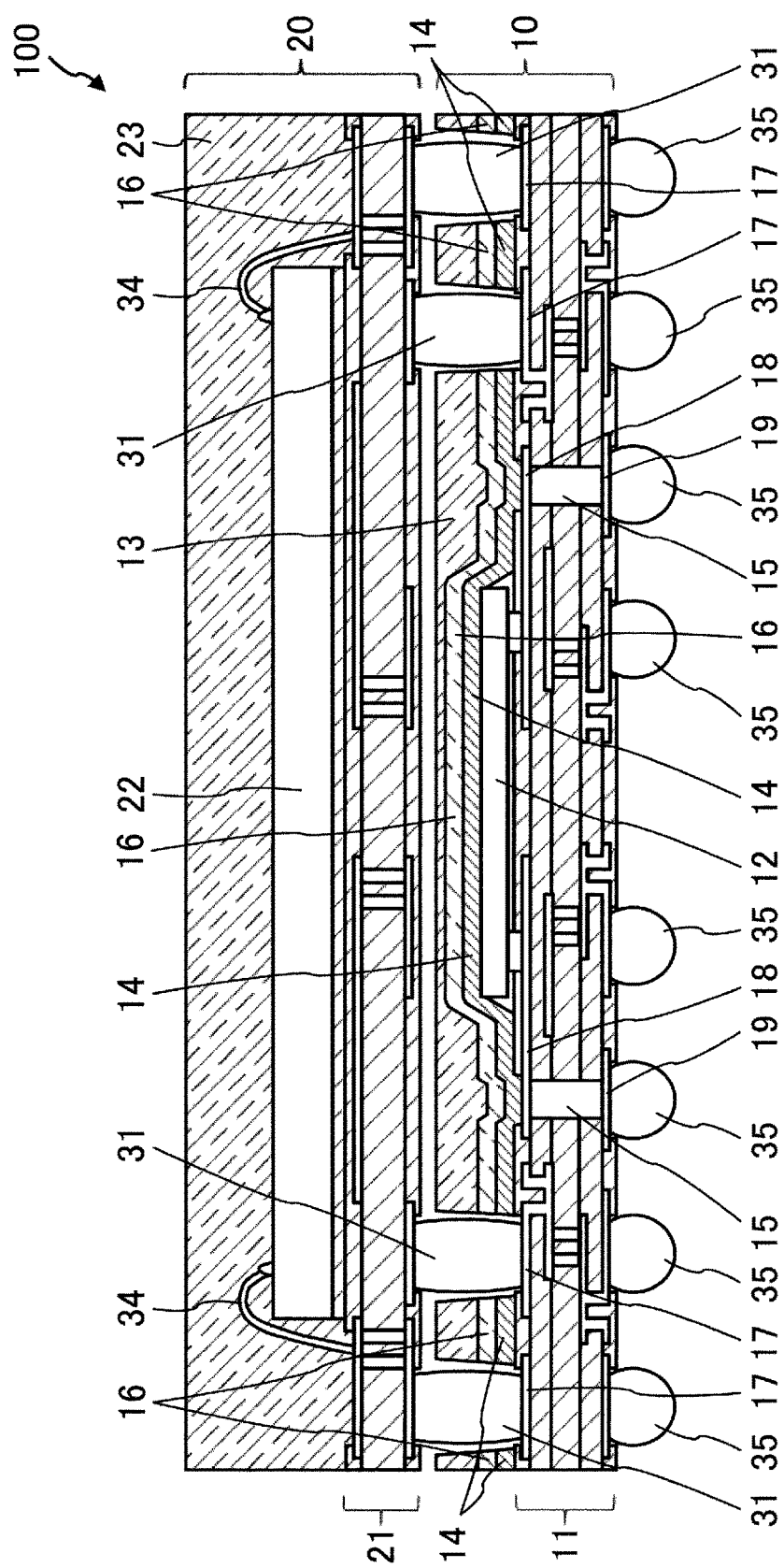
FIG. 14 is a cross-sectional view of a stacked semiconductor package in a modification of embodiment 6 according to the present invention.

FIG. 14 is a cross-sectional view of a stacked semiconductor package 100 in a modification of embodiment 6 according to the present invention. Referring to FIG. 14, it is seen that the top part of the first semiconductor package 10 is filled with the sealing resin 13 and that the sealing resin 13 is provided on the heat transfer layer 16, which is provided on the heat transfer member 14. The low heat transfer layer 16 is provided on the heat transfer member 14, and the sealing resin 13 is provided thereon. Owing to this structure, the stacked semiconductor package 100 in the modification of embodiment 6 according to the present invention shown in FIG. 14 decreases the heat transfer from the first semiconductor device 12 to the second semiconductor device 22 more than the structure in embodiment 6 shown in FIG. 13.

Embodiment 7

An overview of a stacked semiconductor package 100 in embodiment 7 according to the present invention will be described with reference to FIG. 15 and FIG. 16.

Figure 15:
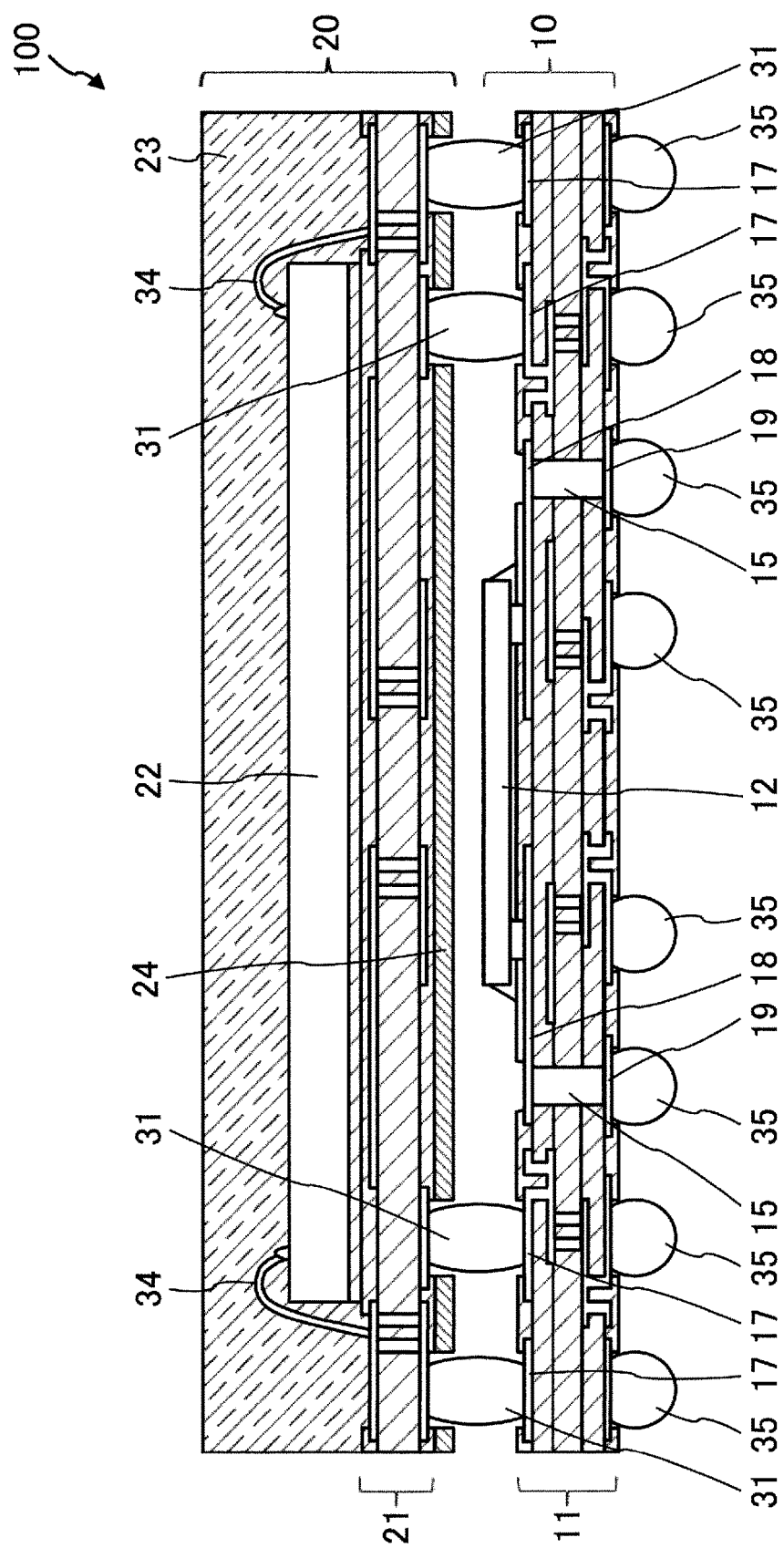
FIG. 15 is a cross-sectional view of a stacked semiconductor package in embodiment 7 according to the present invention.
Figure 16:
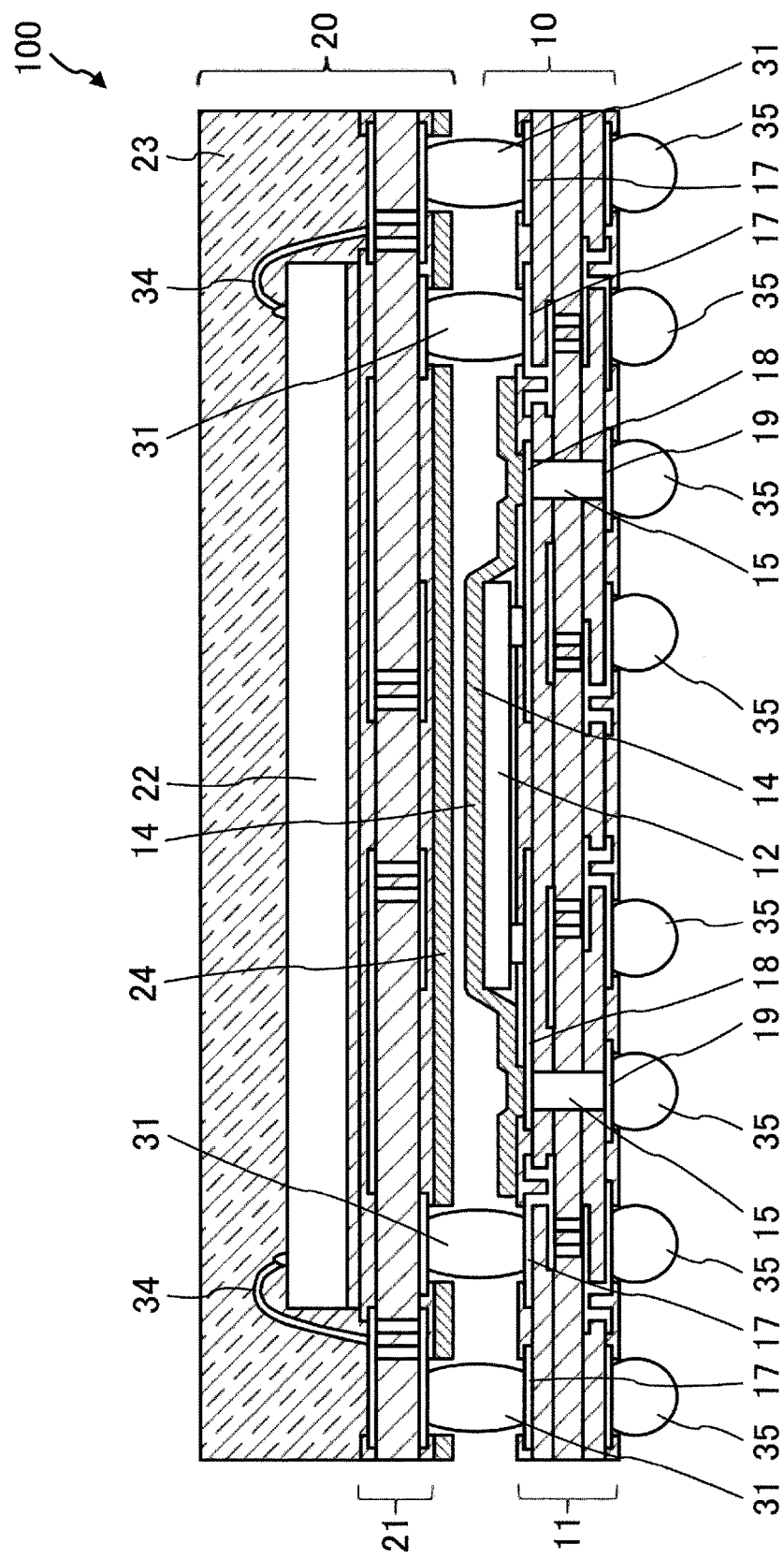
FIG. 16 is a cross-sectional view of a stacked semiconductor package in a modification of embodiment 7 according to the present invention.

FIG. 15 is a cross-sectional view of the stacked semiconductor package 100 in embodiment 7 according to the present invention. Referring to FIG. 15, it is seen that a heat transfer member 24 is provided on the entirety of the bottom surface of the second semiconductor package 20. The materials usable for, and the characteristics of the heat transfer member 24 are substantially the same as those described in embodiments 1 through 6 regarding the heat transfer member 14. The heat transfer member 24 is formed on the entirety of a surface, of the second circuit board 21, that faces the first semiconductor package 10, and then holes are formed in the heat transfer member 24 to expose the electrodes to be connected to the solder balls 31.

The heat transfer member 24 is provided on the entirety of the bottom surface of the second semiconductor package 20. Owing to this structure, the heat transferred from the first semiconductor device 12 to a part of the heat transfer member 24 corresponding to the top part of the first semiconductor device 12 is diffused in the planar direction. Namely, the heat generated in the first semiconductor device 12 is diffused to the entirety of the second semiconductor package 20 and prevents the heat from concentrating to the top part of the first semiconductor device 12. This decreases the heat transfer from the first semiconductor device 12 to the second semiconductor device 22 of the second semiconductor package 20, which is provided above the first semiconductor package 10. Thus, operational malfunction of the second semiconductor device 22 is suppressed.

In FIG. 15, the heat transfer member 24 is provided on the entirety of the bottom surface of the second semiconductor package 20. The area size and the shape of the area where the heat transfer member 24 is located are not limited to the above. It should be noted, however, that it is desirable that the area where the heat transfer member 24 is located is large to a maximum possible degree in order to diffuse the heat generated in the first semiconductor device 12 to the entirety of the second semiconductor package 20.

Modification of Embodiment 7

Embodiment 7 is usable together with any one of embodiments 1 through 6. FIG. 16 is a cross-sectional view of a stacked semiconductor package 100 in a modification of embodiment 7 according to the present invention. FIG. 16 shows a structure obtained by combining embodiment 1 and embodiment 7. More specifically, the heat transfer member 14 is provided on the top surface of the first semiconductor package 10, namely, on the first semiconductor device 12 and on the part, of the first circuit board 11, that is around the first semiconductor device 12, and the heat transfer member 24 is provided on the entirety of the bottom surface of the second semiconductor package 20.

Embodiment 7 may be combined with any one of embodiments 1 through 6. The resultant structure decreases the heat transfer from the first semiconductor device 12 to the second semiconductor device 22 more than the structure in each of embodiments 1 through 6.

Embodiments 1 through 7 have been described with reference to FIG. 1 through FIG. 16. The present invention is not limited to any of the above-described embodiments and may be appropriately altered without departing from the gist of the invention.

What is claimed is:

1. A stacked semiconductor package, comprising:
   a first semiconductor package including a first circuit board and a first semiconductor device mounted on the first circuit board;
   a second semiconductor package including a second circuit board and a second semiconductor device mounted on the second circuit board, the second semiconductor package being stacked on the first semiconductor package; and
   a heat transfer layer provided over the first semiconductor device and a part of the first circuit board, the part being around the first semiconductor device,
   wherein the first circuit board includes a thermal via extending through the first circuit board,
   the heat transfer layer is in contact with the first semiconductor device and the first circuit board, and is connected to the thermal via,
   the heat transfer layer includes a first heat transfer layer and a second heat transfer layer, and
   the second heat transfer layer having a thermal conductivity lower than the thermal conductivity in the thickness direction of the first heat transfer layer and having a heat-insulating property.

2. The stacked semiconductor package according to claim 1,
   wherein the first semiconductor package includes a plurality of joining electrode terminals joined with the second semiconductor package and provided around the first semiconductor device, and
   the heat transfer layer is located inner to the plurality of joining electrode terminals.

3. The stacked semiconductor package according to claim 1,
   wherein the first semiconductor package includes a plurality of joining electrode terminals joined with the second semiconductor package and provided around the first semiconductor device, and
   the heat transfer layer is provided on substantially an entire surface of the first semiconductor package while enclosing the plurality of joining electrode terminals.

4. The stacked semiconductor package according to claim 1, wherein the thermal via is in contact with a power supply plane or a ground plane included in the first circuit board.

5. The stacked semiconductor package according to claim 1, wherein the heat transfer layer has a thermal conductivity in a planar direction higher than a thermal conductivity thereof in a thickness direction.

6. The stacked semiconductor package according to claim 1, wherein the heat transfer layer is formed of any one of carbon fiber prepreg, carbon fiber sheet and carbon graphite sheet.

7. The stacked semiconductor package according to claim 1,
   wherein the second heat transfer layer and the second circuit board are separated from each other.

8. The stacked semiconductor package according to claim 1, further comprising a sealing resin provided on a top surface of the heat transfer layer.

9. The stacked semiconductor package according to claim 1, wherein the heat transfer layer has a shape of a cross having a width smaller than a length of each of sides of the first semiconductor device.

10. The stacked semiconductor package according to claim 1, wherein the heat transfer layer has a cutout as seen in a plan view.

11. The stacked semiconductor package according to claim 7, wherein the first heat transfer layer is arranged on the side of the first circuit board with respect to the second heat transfer layer, and the second heat transfer layer is arranged on the side of the second circuit board with respect to the first heat transfer layer.

* * * * *